(12) United States Patent
Sasaki et al.

(10) Patent No.: US 6,987,894 B2
(45) Date of Patent: Jan. 17, 2006

(54) APPEARANCE INSPECTION APPARATUS AND METHOD IN WHICH PLURAL THREADS ARE PROCESSED IN PARALLEL

(75) Inventors: Yoshihiro Sasaki, Tokyo (JP); Masahiko Nagao, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 692 days.

(21) Appl. No.: 09/841,096

(22) Filed: Apr. 25, 2001

(65) Prior Publication Data

US 2001/0042065 A1    Nov. 15, 2001

(30) Foreign Application Priority Data

Apr. 28, 2000 (JP) ............................. 2000-129041

(51) Int. Cl.
  *G06K 9/54* (2006.01)
  *G06K 9/60* (2006.01)
(52) U.S. Cl. .................. 382/304; 382/145; 382/147; 700/4; 700/110
(58) Field of Classification Search ........... 382/141, 382/145, 146, 147, 304; 700/4, 110; 345/505; 718/107; 717/119; 712/203; 235/462.1
See application file for complete search history.

(56) References Cited

U.S. PATENT DOCUMENTS 5,936,224 A * 8/1999 Shimizu et al. .......... 235/462.1
6,594,590 B2 * 7/2003 Woods et al. .............. 702/35
6,728,419 B1 * 4/2004 Young .................... 382/276

FOREIGN PATENT DOCUMENTS

| JP | 7-128249 | 5/1995 |
| JP | 2500649 | 3/1996 |
| JP | 10-304184 | 11/1998 |
| JP | 11-135054 | 5/1999 |
| JP | 11-259434 | 9/1999 |

OTHER PUBLICATIONS

Law, Schroder, Martin, Temkin; Oct. 1999, A multi-threaded streaming pipeline architecture for structured data sets; Visualization '99. Proceedings; pp. 225-232.*
whatis.com, keyword: thread.*

* cited by examiner

Primary Examiner—Bhavesh M. Mehta
Assistant Examiner—John Strege
(74) Attorney, Agent, or Firm—Young & Thompson

(57) ABSTRACT

An appearance inspection apparatus is composed of a memory 14, a thread generator and a plurality of CPUs 10 to 13. The memory 14 stores image data of an appearance of an IC. The thread generator generates a thread in which a procedure is described for independently processing the image data stored in the memory 14 and storing the processing result into the memory 14. The plurality of CPUs 10 to 13 for executing the plurality of threads generated by the thread generator, in parallel. Thus, this can provide an appearance inspection apparatus and an appearance inspection method that can execute an appearance inspection at a high speed, irrespectively of a simple configuration.

8 Claims, 7 Drawing Sheets

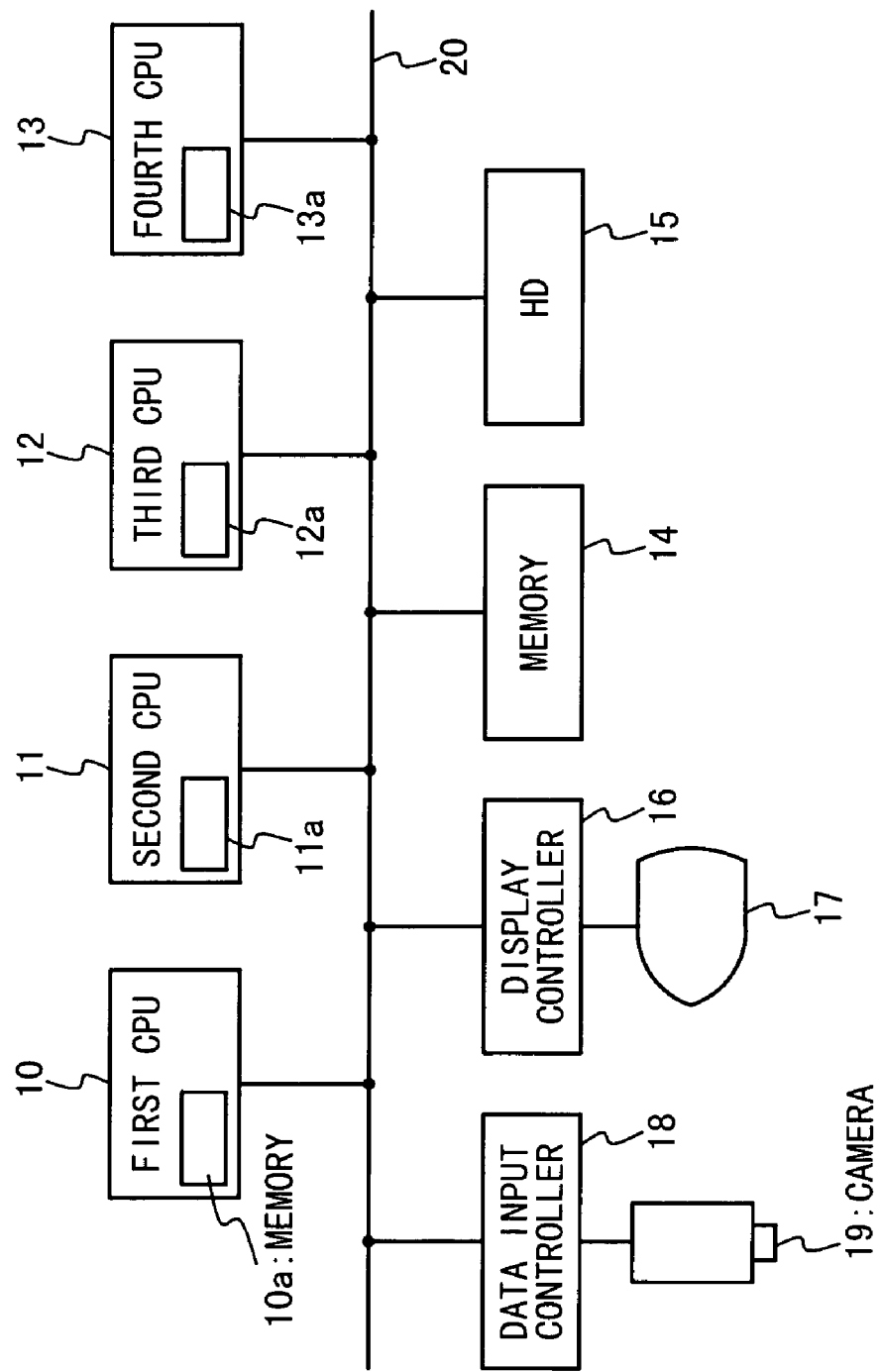

Fig. 2

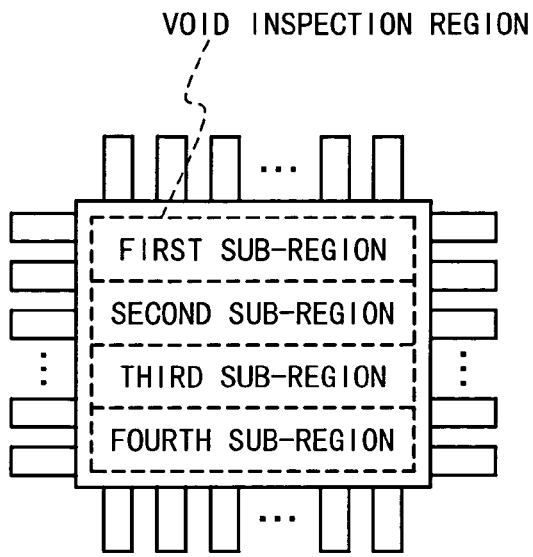

VOID INSPECTION REGION

Fig. 3

| THREAD 1 | FIRST SUB-REGION:ADDRESS/BINARY CONVERSION | A1 → A2 |
|---|---|---|
| THREAD 2 | SECOND SUB-REGION:ADDRESS/BINARY CONVERSION | B1 → B2 |
| THREAD 3 | THIRD SUB-REGION:ADDRESS/BINARY CONVERSION | C1 → C2 |
| THREAD 4 | FOURTH SUB-REGION:ADDRESS/BINARY CONVERSION | D1 → D2 |
| THREAD 5 | FIRST SUB-REGION:ADDRESS/INVERSION | A2 → A3 |
| THREAD 6 | SECOND SUB-REGION:ADDRESS/INVERSION | B2 → B3 |
| THREAD 7 | THIRD SUB-REGION:ADDRESS/INVERSION | C2 → C3 |
| THREAD 8 | FOURTH SUB-REGION:ADDRESS/INVERSION | D2 → D3 |
| THREAD 9 | FIRST SUB-REGION:ADDRESS/AREA MEASUREMENT | A3 |
| THREAD 10 | SECOND SUB-REGION:ADDRESS/AREA MEASUREMENT | B3 |
| THREAD 11 | THIRD SUB-REGION:ADDRESS/AREA MEASUREMENT | C3 |
| THREAD 12 | FOURTH SUB-REGION:ADDRESS/AREA MEASUREMENT | D3 |
| THREAD 13 | ADDRESS/ADDITION OF MEASURED AREA AND JUDGEMENT | |

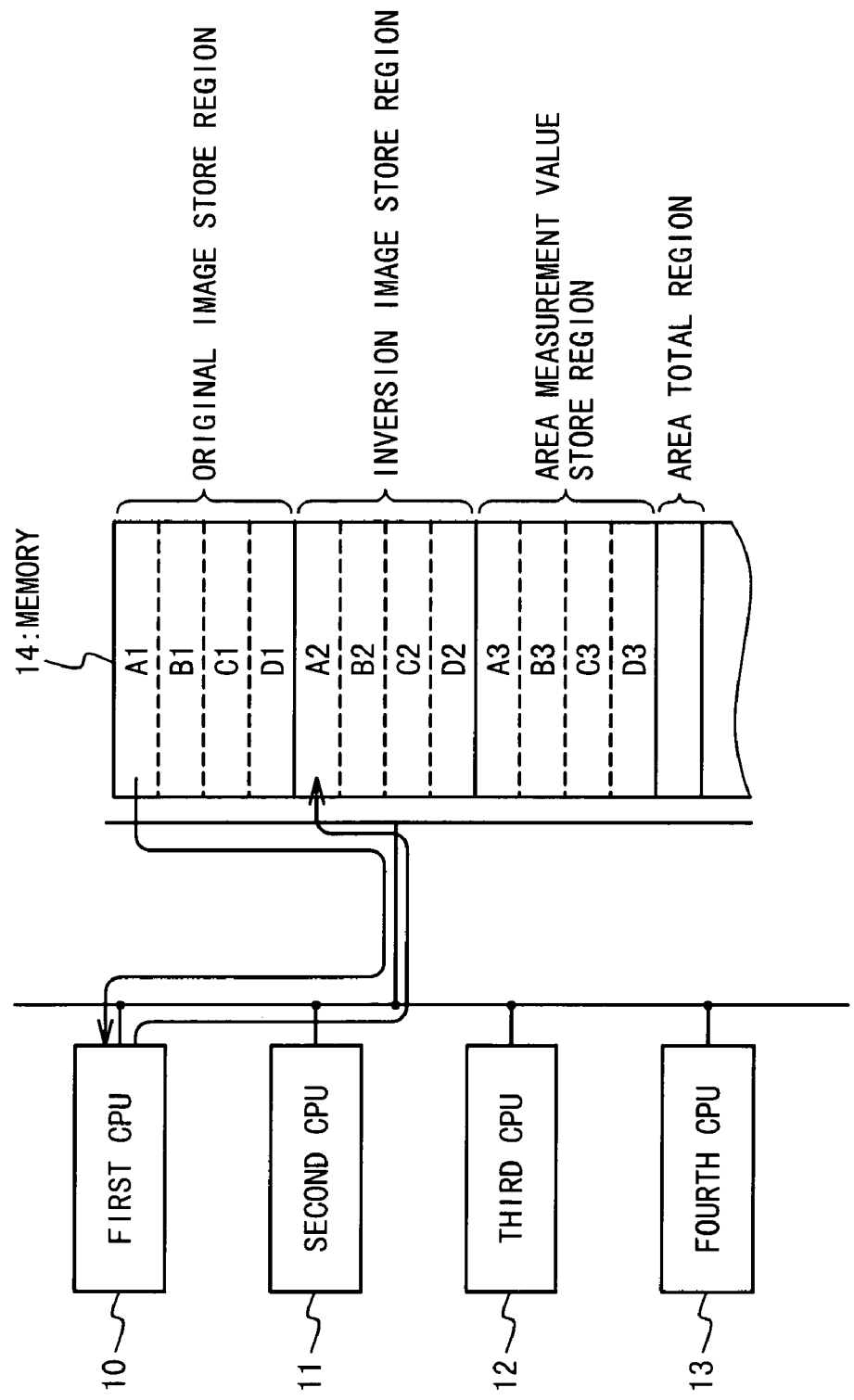

Fig. 5A

| | |
|---|---|
| THREAD 1 | FIRST SUB-REGION:ADDRESS/BINARY CONVERSION |
| THREAD 2 | SECOND SUB-REGION:ADDRESS/BINARY CONVERSION |
| THREAD 3 | THIRD SUB-REGION:ADDRESS/BINARY CONVERSION |
| THREAD 4 | FOURTH SUB-REGION:ADDRESS/BINARY CONVERSION |
| THREAD 5 | FIRST SUB-REGION:ADDRESS/INVERSION |
| THREAD 6 | SECOND SUB-REGION:ADDRESS/INVERSION |
| THREAD 7 | THIRD SUB-REGION:ADDRESS/INVERSION |
| THREAD 8 | FOURTH SUB-REGION:ADDRESS/INVERSION |
| THREAD 9 | SUB-REGION 1-4 AREA MEASUREMENT AND INSPECTION JUDGMENT |

Fig. 5B

THREAD 1

SUB-REGION 1-4

CONVERTING BINARY
↓
INVERTING
↓
AREA MEASUREMENT AND
INSPECTION JUDGMENT

CASE OF HOLDING READ ADDRESS AND WRITE ADDRESS

CASE OF HOLDING READ ADDRESS

CASE OF HOLDING WRITE ADDRESS

APPEARANCE INSPECTION APPARATUS AND METHOD IN WHICH PLURAL THREADS ARE PROCESSED IN PARALLEL

BACKGROUND OF THE INVENTION

1. Field of the Invention

The present invention relates to an appearance inspection apparatus and an appearance inspection method for carrying out an appearance inspection by processing a large amount of image data. More particularly, the present invention relates to a technique for processing the image data in parallel.

2. Description of the Related Art

Conventionally, an appearance inspection apparatus has been known for inspecting an appearance of an integrated circuit (IC) by processing image data generated by photographing the IC. As such an appearance inspection apparatus, for example, Japanese Laid Open Patent Application (JP-A-Heisei, 11-259434) discloses "Parallel Data Processor And Appearance Inspection Apparatus Including It" (hereafter, referred to as a first prior art). In this appearance inspection apparatus, a data input portion driven by a synchronous pulse from a drive signal bus receives image data and then transfers it through a data bus. A process distribution portion and processor elements monitor a state of the drive signal bus, and carries out a communication with each other through a communication bus in a pulse period, namely a high level period of the synchronous pulse.

The process distribution portion monitors a state of the processor elements, and assigns one processor element for processing unit image data to be transferred from the data input portion next in the pulse period of the synchronous pulse. The assigned processor element captures the unit image data from the data bus and processes the captured unit image data, and reports to be processing to the process distribution portion in the pulse period. When the processing is completed, the processor element reports to be waiting to the process distribution portion in a next synchronous pulse period. The above-mentioned configuration can improve an availability ratio of each processor element. Thus, especially, it is possible to attain a high-speed processing of data that is inputted continuously at a large amount, such as image data and the like.

Japanese Laid Open Patent Application (JP-A-Heisei, 11-135054) discloses "Charged Electron Beam Apparatus Having Parallel Image Processor" (hereafter, referred to as a second prior art). In this apparatus, a parallel image processor composed of one master CPU for controlling a data transfer and a plurality of slave CPUs for carrying out a data processing is equipped in an image-processing portion. A calculation program for image processing is downloaded from a control computer to the master CPU and the slave CPUs. The number of parallel image processors is variable. The optimal number of parallel CPUs is determined in advance, depending on a content of image processing. Also, a method of dividing an image data to be processed is variable and determined depending on a kind of image processing and a processing content. According to this apparatus, it is possible to execute not only a basic image processing but also image processing requiring an advanced calculation at a high speed.

Moreover, Japanese Laid Open Patent Application (JP-A-Heisei, 10-304184) discloses "Image Processing Apparatus And Image Processing Method" (hereafter, referred to as a third prior art). In this third prior art, division region data of image data is inputted to a plurality of division input devices. Then, image processing that can be independently processed for each division region is performed on each input division region data by using a pipeline process. The results of those pipeline processes are integrated.

These processes are executed under a control of a first integral-processing portion. That is, the first integral-processing portion issues a command to a pipeline to start the image processing. Also, the first integral processing-portion receives processed partial image data outputted from the pipeline, carries out a positioning operation, generates entire image data, and stores it in an image memory.

Also, for the sake of image processing which requires referring to a wide region, for example, such as a rotation of an image, it has a plurality of image processing portion and a second integral processing-portion for controlling them. This second integral processing-portion integrates the results processed by the plurality of image processors, and stores them in the image memory. The image processing at the high speed can be attained by executing the image processing independently performed for each division region and the image processing referring to the wide region at any order.

In the first prior art, every time the image data is inputted, the process distribution portion assigns the element processor. Thus, an overhead for the assignment is large to thereby impose a limitation on a high-speed processing. It is expected to require a process for integrating the results processed by the respective element processors, although this is not disclosed in detail.

In the second prior art, the slave CPUs are sequentially assigned under the control of the master CPU, similarly to the first prior art. The respective slave CPUs process the image data in parallel. Thus, this second prior art also has the problem similar to that of the first prior art.

In the third prior art, the first and second integral-processing portion carry out the operations, such as the start of the image processing, the integration of the processed image data and the like. Thus, the overhead is large to thereby result in the limitation on the high-speed processing of the image data. Also, it requires the two kinds, such as a section to carry out the image processing for each division region and a section to carry out the image processing for referring to the wide region. Hence, the configuration of the image processor is complex, and the size thereof is large.

Japanese Patent No. 2500649 discloses an IC extraneous material inspection apparatus that can detect an extraneous material such as mold fragment and fiber dust deposited between leads of IC.

SUMMARY OF THE INVENTION

Therefore, an object of the present invention is to provide an appearance inspection apparatus and an appearance inspection method that can execute an appearance inspection at a high speed, irrespectively of a simple configuration.

In order to achieve the above-mentioned object, an appearance inspection apparatus according to a first aspect of the present invention includes a memory, a thread generator and a plurality of CPUs.

The memory stores image data of an appearance of an inspection target. The thread generator generates a plurality of threads in each of which a procedure is described for independently processing the image data stored in the memory and storing a processing result into the memory. The plurality of CPUs executes the plurality of threads generated by the thread generator in parallel, respectively.

In the appearance inspection apparatus according to this first aspect of the present invention, the plurality of threads for independently processing the image data stored in the memory are executed by each of the plurality of CPUs. Here, the independent processing implies a self-completion process of each thread, in other words, a process that is carried out based on data of self-possession and completed by writing the processed result to a position based on the data of the self-possession. Thus, it is not necessary that the process is carried out after a reply to data given from external portion and then the processed results are further integrated at the external portion, such as the conventional image processing apparatus. As a result, the configuration of the appearance inspection apparatus can be simple to thereby enable the high-speed processing of the image data.

In the appearance inspection apparatus according to the first aspect of the present invention, the thread generator may generate k sets of n (k is a positive integer and n is an integer equal to or greater than 2) threads in which procedures are described for respectively processing the image data in n sub-regions obtained by dividing one inspection region on the image data stored in the memory, and the plurality of CPUs execute the k sets of the n threads generated by the thread generator in parallel, respectively.

Also, in this appearance inspection apparatus, the thread generator further may generate m (m is a positive integer) threads in each of which a procedure is described for collectively processing the image data in the n sub-regions, and the plurality of CPUs execute the k sets of the n threads generated by the thread generator in parallel, respectively, and one of the plurality of CPUs singly executes the m threads generated by the thread generator.

In these cases, the n and m may be determined based on a kind of image processing to be executed or a size of the inspection region. Or, the n and m are determined based on a result of an actual measurement of processing times of the plurality of CPUs under an arbitrary combination of n and m.

In each of the n threads, the procedure may be described for executing a predetermined kind of image processing and another kind of image processing in succession. Or, in each of the n threads, the procedure is described for executing a predetermined kind of image processing and another kind of image processing in succession.

Also, in the appearance inspection apparatus according to the first aspect of the present invention, the thread generator generates at least n (n is an integer equal to or greater than 2) threads in which procedures are described for respectively processing the image data in n inspection regions on the image data stored in the memory, and the plurality of CPUs execute the n threads generated by the thread generator in parallel, respectively.

Also, in order to achieve the above-mentioned object, an appearance inspection method according to a second aspect of the present invention includes a storing step, a generating step and an executing step. In the storing step, image data of an appearance of an inspection target is stored in a memory. In the generating step, a plurality of threads is generated in each of which a procedure is described for independently processing the image data stored in the memory and storing a processing result into the memory. In the executing step, the generated plurality of threads is executed in parallel.

In the appearance inspection method according to the second aspect of the present invention, the thread generating step may generate k sets of n (k is a positive integer and n is an integer equal to or greater than 2) threads in which procedures are described for respectively processing the image data in n sub-regions obtained by dividing one inspection region on the image data stored in the memory, and the executing step executes the generated k sets of the n threads in parallel.

In this method, the thread generating step further may generate m (m is a positive integer) threads in each of which a procedure is described for collectively processing the image data in the n sub-regions, and the executing step further executes the generated m threads in serial.

In these cases, the n and m are determined based on a kind of image processing to be executed or a size of the inspection region. Or, the n and m are determined based on a result of an actual measurement of processing times executed under an arbitrary combination of n and m.

In each of the n threads, the procedure may be described for executing a predetermined kind of image processing and another kind of image processing in succession. Or, in each of the n threads, the procedure may be described for executing a predetermined kind of image processing and another kind of image processing in succession.

In the appearance inspection method according to the second aspect of the present invention, the thread generating step generates at least n (n is an integer equal to or greater than 2) threads in which procedures are described for respectively processing the image data in n inspection regions on the image data stored in the memory, and the executing step executes the generated n threads in parallel.

BRIEF DESCRIPTION OF THE DRAWINGS

FIG. 1 is a block diagram showing a schematic configuration of an appearance inspection apparatus according to first to fourth embodiments of the present invention;

FIG. 2 is a view showing an example of an image data of an IC stored in a memory, in the appearance inspection apparatus according to the first and second embodiments of the present invention;

FIG. 3 is a view showing an example of a thread generated for a void inspection, in the appearance inspection apparatus according to the first embodiment of the present invention;

FIG. 4 is a view describing an operation of a void inspection in the appearance inspection apparatus according to the first embodiment of the present invention;

FIGS. 5A and 5B are views showing an example of a thread generated for a void inspection, in the appearance inspection apparatus according to the second embodiment of the present invention;

DESCRIPTION OF THE PREFERRED EMBODIMENTS

Figure 6:
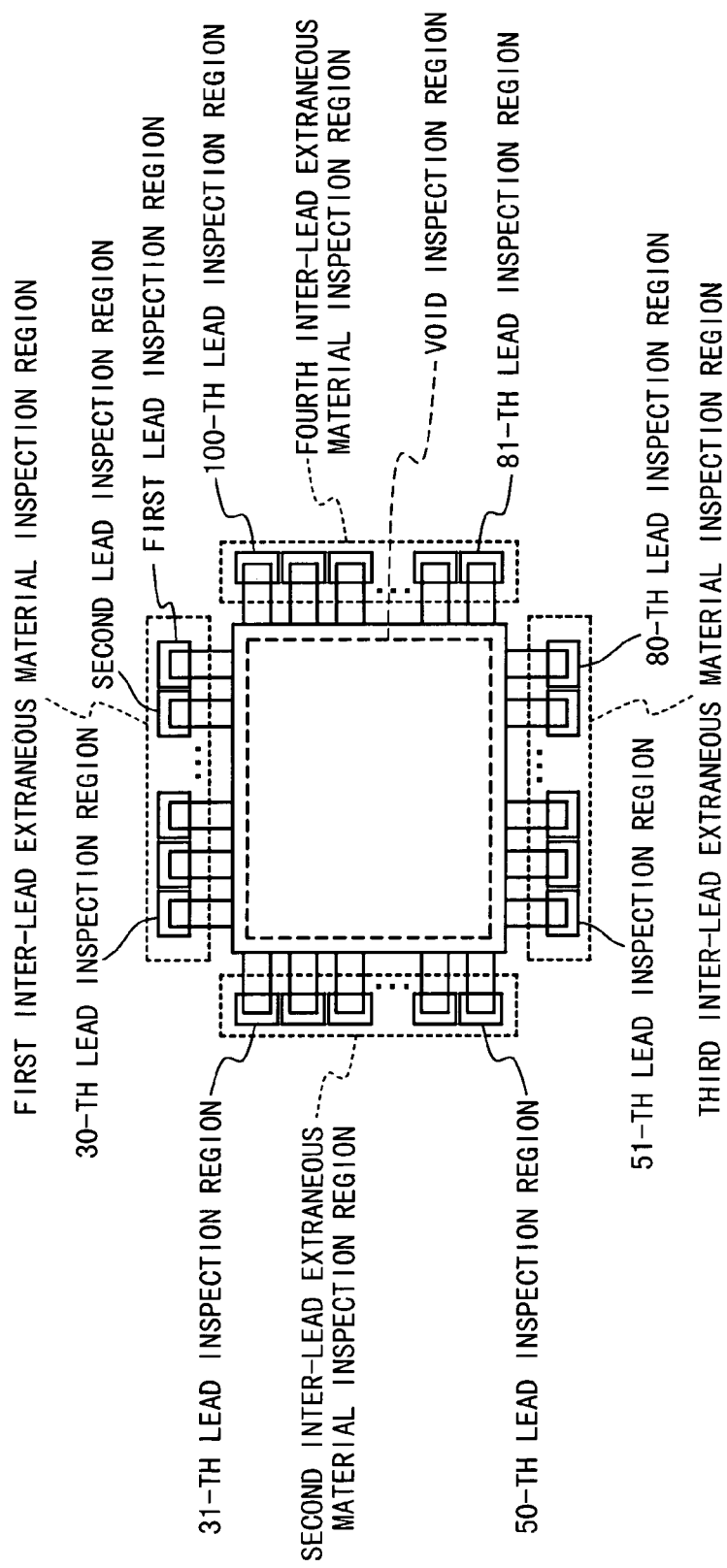
FIG. 6 is a view showing an example of an image data of an IC stored in a memory, in the appearance inspection apparatus according to the third embodiment of the present invention.

Embodiments of the present invention will be described below with reference to the attached drawings. In each embodiment, an example in which an integrated circuit (IC) is used as an inspection target will be described.

FIG. 1 is a block diagram showing a schematic configuration of an appearance inspection apparatus according to first to third embodiments of the present invention. This appearance inspection apparatus can be composed of a general-purpose computer such as a personal computer having a plurality of CPUs, a workstation and a server. In this case, as software for controlling the general-purpose computer, an operating system (OS) which works under multi-thread environment, such as Windows NT(R), Windows 2000 (R) and UNIX can be used.

This appearance inspection apparatus is configured such that the members such as a first CPU 10, a second CPU 11, a third CPU 12, a fourth CPU 13, a memory 14, a hard disc drive 15, a display controller 16 and a data input controller 18 are connected to each other by a system bus 20. The system bus 20 is used to carry out a data transmission between the members. Also, a display device 17 is connected to the display controller 16. A camera 19 is connected to the data input controller 18.

Each of the first CPU 10, the second CPU 11, the third CPU 12 and the fourth CPU 13 is independently operated under the control of the OS, at the same time. The first CPU 10, the second CPU 11, the third CPU 12 and the fourth CPU 13 are operated in accordance with a thread composed of a small program module, which is passed from the OS. It should be noted that the OS merely carries out a control to pass the thread to the CPUs 10 to 13. So, as the process distribution portion, the master CPU and the integral-processing portion which is described in the conventional technique, the OS does not carry out an operation for instructing a process content to each CPU, integrating the processed results from the respective CPUs, and generating the entire image data.

The first CPU 10, the second CPU 11, the third CPU 12 and the fourth CPU 13 have memories 10a, 11a, 12a and 13a, respectively. Each of those memories 10a, 11a, 12a and 13a stores the above-mentioned thread.

In each thread, a procedure, namely, a program for carrying out image processing is described. The first CPU 10 executes the image processing based on the thread stored in the memories 10a. The second CPU 11 executes the image processing based on the thread stored in the memories 11a. The third CPU 10 executes the image processing based on the thread stored in the memories 12a. The fourth CPU 13 executes the image processing based on the thread stored in the memories 13a. Each of the first CPU 10 to the fourth CPU 13 executes the operations for reading out the image data from the memory 14, performing a predetermined process on the read image data and storing the processed result in the memory 14, in parallel.

The memory 14 stores the image data inputted through the data input controller 18 from the camera 19, the processed result of this image data and the like. A concrete using method of the memory 14 will be described later.

The hard disc (HD) drive 15 stores a program for controlling a whole of this appearance inspection apparatus, and an inspect data to be used for an appearance inspection. The threads are generated by executing the program read from the hard disc drive 15. The generated threads are transferred to the memories 10a, 11a, 12a and 13a of the first CPU 10, the second CPU 11, the third CPU 12 and the fourth CPU 13, respectively.

The display controller 16 controls the display device 17. This display device 17 displays, for example, an image of an appearance of an IC based on the image data obtained from the camera 19, a message indicative of a processed result, and the like.

The camera 19 is used to photograph the appearance of the IC. This camera 19 can be constituted by, for example, a CCD camera. Analog image data generated when the appearance of the IC is photographed by using the camera 19 is sent to the data input controller 18.

The data input controller 18 converts the analog image data from the camera 19 into digital image data (hereafter, merely referred to as "Image Data") composed of a set of pixels having, for example, 256 gradations. This image data generated by the data input controller 18 is transferred through the system bus 20 to the memory 14, for example, under the control of a DMA unit (not shown).

The appearance inspection apparatus having the above-mentioned configuration is used for the various inspections, such as a void inspection, an inter-lead extraneous material inspection, a lead inspection, a mold inspection, and a seal inspection. In the void inspection, whether or not a void is present in a mold forming an IC package is inspected. In the inter-lead extraneous material inspection, it is inspected that an extraneous material is not deposited on a lead. In the lead inspection, whether or not a lead is abnormal is inspected. In the mold inspection, whether or not there is an abnormal mold is inspected. In the seal inspection, whether or not a seal is normal is inspected.

Now, the operations of the appearance inspection apparatus having the above-mentioned configuration will be described below.

(First Embodiment)

In the appearance inspection apparatus according to the first embodiment of the present invention, one inspection region on image data is divided into four sub-regions. The image data on the respective sub-regions are processed in parallel by using four CPUs. The case of the void inspection will be described below as an example. It should be noted that, in this first embodiment, "n" of the present invention is "4", "k" of the present invention is "3" and "m" of the present invention is "1".

In this void inspection, "Binary Conversion Process", "Inversion Process", "Area Measurement Process", and "Inspection Judgement Process" are sequentially carried out. In the "Binary Conversion Process", an image data, which is sent from the camera 19 through the data input controller 18 and the system bus 20 and stored in the memory 14, is converted into a binary value. In the "Inversion Process", the binary value is inverted to thereby generate binary image data. In the "Area Measurement Process", an area of the inverted binary image data is measured. In the "Inspection Judgement Process", the measured areas are added up and accordingly judged a presence or absence of a void.

When the void inspection is executed, a thread is firstly generated in accordance with a following procedure. FIG. 2 shows an example of image data of an IC stored in the memory 14. In the void inspection, a void inspection region is set on a package portion of the image data. The set void inspection region is divided into four sub-regions of a first sub-region, a second sub-region, a third sub-region and a fourth sub-region. Then, a thread is generated for processing the image data in each sub-region.

FIG. 3 shows an example of threads generated for the void inspection. In this example, thirteen threads respectively named "thread 1" to "thread 13" are generated. Each thread includes a command and an address. The command instructs a content of image processing to be executed. The address specifies a position of image data to be processed on the memory 14. The address included in the thread may be any of: only a read address indicative of a position on the memory 14 in which the image data to be processed is stored; both of the read address and a write address indicative of a position on the memory 14 in which the processed image data is stored; and only the write address.

It should be noted that, if only the read address is included in the thread, the write address is generated on the basis of this read address and the command. Similarly, if only the write address is included in the thread, the read address is generated on the basis of this write address and the command.

In the threads 1 to 4, the procedures for converting the image data in the first to fourth sub-regions into binary values are described, respectively. In the threads 5 to 8, the procedures for inverting the binary image data in the first to fourth sub-regions are described, respectively. In the threads 9 to 12, the procedures for measuring the areas of the inverted image data in the first to fourth sub-regions are described, respectively. Also, in the thread 13, the procedure for adding up the measured areas in the first to fourth areas, and judging the presence or absence of the void is described.

The threads generated as mentioned above are sequentially assigned to any of the first CPU 10, the second CPU 11, the third CPU 12 and the fourth CPU 13 by the OS. That is, the OS transfers the threads to memories of the CPUs being at an empty state. Accordingly, the void inspection is started.

FIG. 4 is a view describing the operation of the void inspection. Hereafter, let us suppose that each thread has a read address and a write address. Also, let us suppose that an image data captured from the camera 19 is stored in an original image store region of the memory 14.

At an initial state, all of the first CPU 10, the second CPU 11, the third CPU 12 and the fourth CPU 13 are at an empty state. Accordingly, the OS transfers the thread 1 to the memory 10a of the first CPU 10, the thread 2 to the memory 11a of the second CPU 11, the thread 3 to the memory 12a of the third CPU 12, and the thread 4 to the memory 13a of the fourth CPU 13, respectively.

The first CPU 10 receiving the thread 1 executes a process in accordance with the procedure described in the thread 1. That is, it sequentially reads an image data A1 from a position specified by the read address of the original image store region of the memory 14 (a position corresponding to a top of the first sub-region), and converts the read image data into a binary value. That is, it slices each pixel constituting the read image data on the basis of a threshold level suitable for the image data, and converts into data of "0" or "1" to thereby generate binary image data A2. The generated binary image data A2 is sequentially stored in a position specified by the write address of an inversion image store region of the memory 14 (the position corresponding to the top of the first sub-region).

Similarly, the second CPU 11 reads image data B1 from a position specified by the read address of the original image store region of the memory 14 (a position corresponding to a top of the second sub-region), and converts into a binary value to thereby generate binary image data B2, and then stores the generated binary image data B2 in a position specified by the write address of the inversion image store region of the memory 14 (the position corresponding to the top of the second sub-region). The third CPU 12 and the fourth CPU 13 are also similar to the above-mentioned cases. The above-mentioned binary conversion processes in the first CPU 10, the second CPU 11, the third CPU 12 and the fourth CPU 13 are executed in parallel to each other. When the respective CPUs have completed the binary conversion processes, the binary image data are stored in the inversion image store region of the memory 14.

Next, the OS sequentially transfers the threads 5, 6, 7 and 8 to the memories of the CPUs in an order of the CPUs that completed the binary conversion processes. Accordingly, each CPU starts the inversion process. Here, let us suppose that the binary conversion processes are completed in the order of the first CPU 10, the second CPU 11, the third CPU 12 and the fourth CPU 13. So, the first CPU 10 sequentially reads the image data A2 from a position specified by the read address of the inversion store region of the memory 14 (the position corresponding to the top of the first sub-region), and inverts it to thereby generate inverted image data A3. The inverted image data A3 is sequentially stored in a position specified by a write address of an area measurement value store region of the memory 14 (the position corresponding to the top of the first sub-region).

Similarly, the second CPU 11 sequentially reads the image data B2 from a position specified by the read address of the inversion store region of the memory 14 (the position corresponding to the top of the second sub-region), and inverts it to thereby generate inverted image data B3. The inverted image data B3 is stored in a position specified by a write address of the area measurement value store region of the memory 14 (the position corresponding to the top of the second sub-region). The third CPU 12 and the fourth CPU 13 are also similar to the above-mentioned cases. The above-mentioned inversion processes in the first CPU 10, the second CPU 11, the third CPU 12 and the fourth CPU 13 are executed in parallel to each other. When the respective CPUs have completed the inversion processes, the inverted image data are stored in the area measurement value store region of the memory 14.

Next, the OS sequentially transfers the threads 9, 10, 11 and 12 to the memories of the CPUs in an order of the CPUs that completed the inversion processes. Accordingly, each CPU starts an area measurement process. Here, let us suppose that the inversion processes are completed in the order of the first CPU 10, the second CPU 11, the third CPU 12 and the fourth CPU 13. The first CPU 10 sequentially reads the image data A3 from a position specified by the read address of the area measurement value store region of the memory 14 (the position corresponding to the top of the first sub-region), and calculates an area. This calculation result is stored in a position specified by a write address of an area total region of the memory 14.

Similarly, the second CPU 11 sequentially reads the image data B3 from a position specified by the read address of the area measurement value store region of the memory 14 (the position corresponding to the top of the second sub-region), and calculates an area. This calculation result is stored in a position specified by the write address of the area total region of the memory 14. The third CPU 12 and the fourth CPU 13 are also similar to the above-mentioned cases. The above-mentioned area measurement processes in the first CPU 10, the second CPU 11, the third CPU 12 and the fourth CPU 13 are executed in parallel to each other. When the respective CPUs have completed the area measurement processes, the areas of the first sub-region, the second sub-region, the third sub-region and the fourth sub-region in the void inspection region are stored in the area total region of the memory 14.

When all the CPUs have completed the area measurement processes, the OS then selects any one of the first CPU 10, the second CPU 11, the third CPU 12 and the fourth CPU 13, and transfers the thread 13 to the memory of the selected CPU. Accordingly, the selected CPU reads the area measurement values from the position specified by the read address of the area total region of the memory 14, and adds up the read area measurement values to calculate a total value of the areas. Then, the selected CPU compares the total value with a predetermined judgment value. The selected CPU so judges that a void defect is exist if the total value is greater than the predetermined judgment value. A message indicative of that fact is displayed on the display device 17. The void inspection is ended as mentioned above.

In this first embodiment, if the performances of the first CPU 10, the second CPU 11, the third CPU 12 and the fourth CPU 13 are equal to each other and the sizes of the first sub-region, the second sub-region, the third sub-region and the fourth sub-regions are equal to each other, the times necessary for the binary conversion processes, the inversion processes and the area measurement processes in the respective CPUs are equal to each other. Thus, the time necessary for the binary conversion process, the inversion process and the area measurement process decreases to approximately ¼ when carrying out these processing by one CPU. Hence, it is possible to attain the high-speed processing of the image data.

Also, the write addresses in the respective threads are determined such that the image data in the original image store region, the image data in the inversion image store region and the image data in the area measurement value store region correspond to each other. Thus, it is not necessary to carry out the integrating process such as the positioning of the image data processed by the respective CPUs, as performed in the conventional image processor. As a result, it is possible to simplify the image processing and also possible to attain the high-speed processing of the image data.

Moreover, the appearance inspection apparatus according to the first embodiment uses the general-purpose computer, and the software for controlling this general-purpose computer can use an OS on the market. Thus, it has merit that the apparatus can be cheaply configured.

It should be noted that, in the first embodiment, the void inspection region is divided into the four sub-regions. The thread is generated for executing the binary conversion process, the inversion process and the area measurement process for each sub-region. However, in the respective processes, on the basis of one pixel, the other one pixel is generated. Thus, it can be designed that a thread to continuously execute the binary conversion process, the inversion process and the area measurement process is generated for each sub-region, and those threads are processed in parallel to each other by using a plurality of CPUs.

Also, the first embodiment is designed such that the void inspection region is divided into the four sub-regions, and one CPU is correlated to each sub-region, and the image process is carried out by using a total of four CPUs. However the number of divisions in the void inspection region and the number of CPUs are not limited to "4". The number of divisions and the number of CPUs can be arbitrarily determined.

In this case, it can be designed to obtain the number of CPUs mounted in the appearance inspection apparatus at the time of the thread generation for the void inspection and then generate the threads corresponding to the number of CPUs for each process. According to this design, even if computers in which the numbers of mounted CPUs are different from each other are used as the appearance inspection apparatus, the thread can be generated by a kind of software. Thus, this has merit that it is not necessary to produce the software for each number of CPUs.

Moreover, in the first embodiment, the case of the void inspection is described as the example. However, it is not limited to the void inspection, it may be applied to other various appearance inspections.

(Second Embodiment)

An appearance inspection apparatus according to a second embodiment of the present invention will be described below. The appearance inspection apparatus according to the first embodiment is designed such that all the processes, such as the binary conversion process, the inversion process and the area measurement process, are executed in parallel to each other by the plurality of threads. However, the appearance inspection apparatus according to the second embodiment is designed such that a particular process in the above-mentioned plurality of processes is executed by a single thread. It should be noted that, in this second embodiment, "n" of the present invention is "4", "k" of the present invention is "2" and "m" of the present invention is "1".

A thread generation process to be executed at the time of a void inspection firstly calculates a size of a void inspection region. Then, it is checked whether or not this calculated size is greater than a predetermined set value $\alpha$. If it is judged that the calculated size is greater than the set value $\alpha$, the void inspection region is divided into four sub-regions, similarly to the explanation in the first embodiment. As shown in FIG. 3, 13 threads are generated such that a binary conversion process, an inversion process and an area measurement process are executed for each image data of each sub-region by a plurality of threads, and an inspection judgment process is executed by a single thread.

On the other hand, if it is judged that the calculated size is equal to or less than the predetermined set value $\alpha$, as shown in FIG. 5A, 9 threads are generated such that the binary conversion process and the inversion process are executed for each image data of each sub-region and the area measurement process and the inspection judgment process are executed by the single thread. Then, the thus-generated 9 threads are executed in the procedure similar to that explained in the first embodiment.

In the appearance inspection apparatus according to this second embodiment, if the size of the void inspection region is equal to or less than the predetermined set value $\alpha$, the processing time when the area measurement process and the inspection judgment process are executed by one thread is shorter than that in the case when the area measurement process is executed by four threads and the inspection judgment process is then executed by one thread. Thus, it is possible to shorten the time of the appearance inspection as a whole.

Also, the above-mentioned appearance inspection apparatuses are designed such that the particular process among the plurality of processes is executed by the single thread. However, appearance inspection apparatuses can be varied such that all the processes are executed by the single thread.

In the appearance inspection apparatus according to this variation, a thread generation process to be executed at the time of a void inspection firstly calculated a size of a void inspection region. Then, it is checked whether or not the calculated size is greater than a predetermined set value $\beta$. If it is judged that the calculated size is greater than the set value $\beta$, the void inspection region is divided into four sub-regions, similarly to the explanation in the first embodiment. As shown in FIG. 3, 13 threads are generated such that a binary conversion process, an inversion process and an area measurement process are executed for each image data of each sub-region by a plurality of threads, and an inspection judgment process is executed by a single thread.

On the other hand, if it is judged that the calculated size is equal to or less than the predetermined set value β, as shown in FIG. 5B, one thread is generated such that all of the binary conversion process, the inversion process, the area measurement process and the inspection judgment process are executed by the single thread. Then, the thus-generated one thread is executed in the procedure similar to that explained in the first embodiment.

In the appearance inspection apparatus according to this variation, if the size of the void inspection region is equal to or less than the predetermined set value β, the case when all the processes are executed by the one thread has the shortest processing time. Thus, the time of the appearance inspection can be made fast. The appearance inspection apparatus according to this variation is effective in the case when there are a plurality of void inspection regions of small sizes.

It should be noted that, this appearance inspection apparatus according to the second embodiment of the present invention can be varied as follows. That is, if the size of the void inspection region is greater than the set value α, similarly to the explanation in the first embodiment, the void inspection region is divided into the four sub-regions. Then, the 13 threads are generated such that the binary conversion process, the inversion process and the area measurement process are executed for each image data of each sub-region by the plurality of the threads, and the inspection judgment process is executed by the single thread. If the size of the void inspection region is equal to or less than the set value α and greater than the set value β (α>β) the 9 threads are generated such that the binary conversion process and the inversion process are executed for each image data of each sub-region by the plurality of the threads, and the area measurement process and the inspection judgment process are executed by the single thread. Also, if the size of the void inspection region is equal to or less than the set value β, the one thread is generated such that all of the binary conversion process, the inversion process, the area measurement process and the inspection judgment process are executed by the single thread.

The above-mentioned appearance inspection apparatuses determine the thread to be generated by checking whether or not the size of the void inspection region is greater than the predetermined set value, at the time of the void inspection. However, they can be designed so as to determine in advance a combination of threads in which the appearance inspection can be carried out in the shortest time by actually measuring the processing time, and then store in the hard disc drive 15 as inspection data.

For example, at first, a predetermined process is executed by using four CPUs and four threads, and its execution time is measured. Then, the predetermined process is executed by using one CPU and one thread, and its execution time is measured. Then, they are compared with each other. So, the numbers of CPUs and the threads are determined for carrying out the predetermined process, and stored in the hard disc drive 15 as inspection data. This inspection data is read from the hard disc drive 15 when the predetermined process is executed, and referred at the time of the thread generation.

According to this configuration, the thread generation process at the time of the void inspection generates the thread, in which it is proved that the appearance inspection can be carried out in the shortest time by the actual measurement. Thus, the appearance inspection can be carried out in the shortest time.

It should be noted that the predetermined process may be constituted by one of the binary conversion process, the inversion process, the area measurement process and the inspection judgment process, or may be constituted by a combination of several processes among them, or may be constituted by all of these processes. In short, it is enough to find out, from the above cases, the case in which the appearance inspection can be carried out in the shortest time, and generate the inspection data.

(Third Embodiment)

An appearance inspection apparatus according to a third embodiment of the present invention is designed as follows. That is, when executing a process that is difficult to carry out a parallel process, for example, such as a histogram process or a projection process, if there are a plurality of inspection regions, each sub-region is processed by one thread.

FIG. 6 shows an example of image data of an IC to be used in this third embodiment. In the void inspection, the void inspection region is set on the package portion of the IC, as described in the first and second embodiments.

In an inter-lead extraneous material inspection, first to fourth inter-lead extraneous material inspection regions are set for each side, in a lead portion of the IC. Then, four threads are generated correspondingly to the first to fourth inter-lead extraneous material inspection regions. In each of threads, a procedure for carrying out the inter-lead extraneous material inspection is described.

The OS assigns the thus generated four threads to the first CPU 10, the second CPU 11, the third CPU 12 and the fourth CPU 13, respectively. That is, the OS transfers the threads to the memories of the CPUs being at an empty state. Then, the inter-lead extraneous material inspection is started. This inter-lead extraneous material inspection is explained in detail, for example, in Japanese Laid Open Patent Application (JP-A-Heisei, 7-128249) or Japanese Patent No. 2500649.

In this inter-lead extraneous material inspection, such a process is executed that it is difficult to divide the inter-lead extraneous material inspection region into a plurality of sub-regions and carry out the parallel process by using the plurality of CPUs. So, as mentioned above, the inter-lead extraneous material inspection regions are set for the respective four sides of the IC, and the four CPUs carry out the inter-lead extraneous material inspection. Accordingly, it is possible to improve the CPU usage efficiency and also possible to attain the high-speed processing.

Also, in the lead inspection, first to 100-th lead inspection regions are set for tips of the respective leads, as shown in FIG. 6. Then, 100 threads are generated for each first to 100-th lead inspection regions. In each thread, a procedure for carrying out the lead inspection is described.

The OS sequentially assigns thus-generated 100 threads to the first CPU 10, the second CPU 11, the third CPU 12 and the fourth CPU 13. That is, the OS sequentially transfers the threads to the memories of the CPUs being at an empty state. Then, the lead inspection is started. This lead inspection is carried out, for example, by a method for using an image at a lead tip as a template image, searching for the lead inspection region formed at each lead tip, and then detecting a lead coordinate.

The size of the lead inspection region used in this lead inspection is very small. Thus, there may be a case that when the lead inspection region is divided into a plurality of sub-regions and then the parallel process is carried out by using the plurality of CPUs, the processing time is increased on the contrary. So, the lead inspection region is set for each lead tip, and a total of 100 lead inspections are sequentially carried out by the four CPUs. Accordingly, it is possible to improve the CPU usage efficiency and also possible to attain the high-speed processing.

(Four Embodiment)

As the process that is difficult to divide the inspection region into the plurality of sub-regions and then process them by using the plurality of CPUs, for example, there is a rotation process for rotating a whole or a part of an image. In this rotation process, it is necessary to refer to the whole of image data. However, the parallel process using the plurality of CPUs can be attained by using any of a method of specifying a read address and a write address, a method of specifying only the read address and a method of specifying only the write address.

Figure 7A:
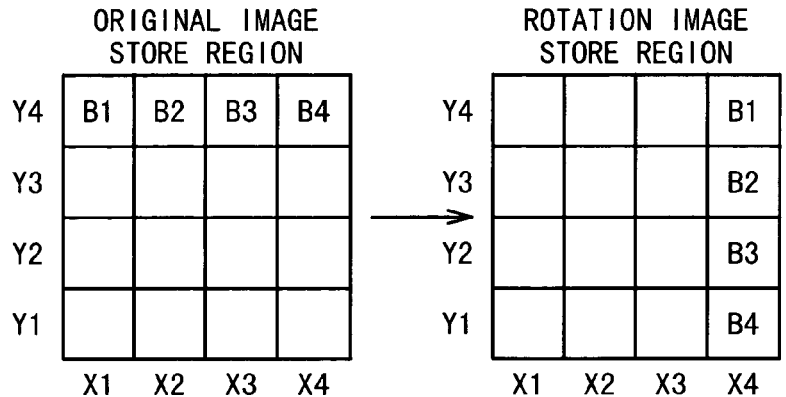
FIGS. 7A, 7B and 7C are views describing an operation of a rotation processing, in the appearance inspection apparatus according to the fourth embodiment of the present invention.
Figure 7B:
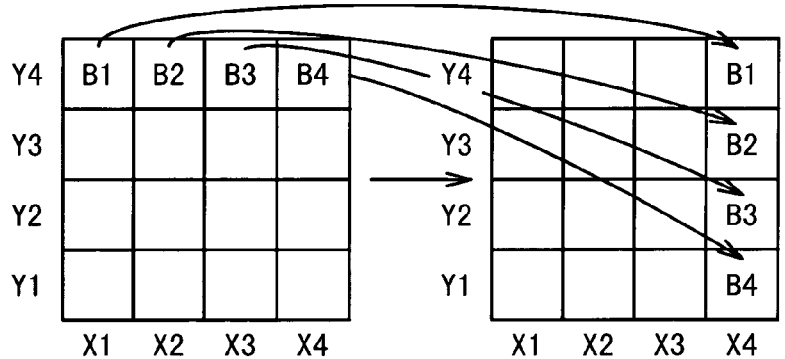
Figure 7C:
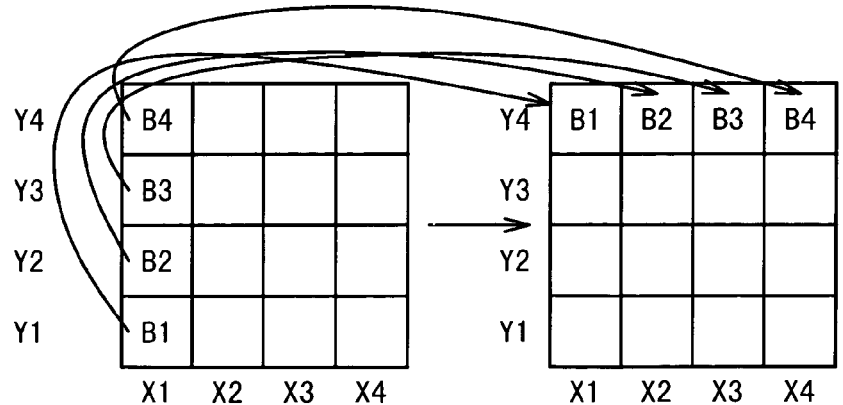

The rotation process executed in this fourth embodiment of the present invention will be described below with reference to FIGS. 7A, 7B and 7C by exemplifying a case of a right rotation of 90 degrees. It should be noted that, for the purpose of simple explanation, FIGS. 7A to 7C show examples in each of which image data of 16 pixels composed of 4 rows×4 columns is rotated by 90 degrees in a right direction. However, the number of pixels that can be treated in this fourth embodiment is not limited to 16, and it is free.

In a thread generation process for this rotation process, a thread is generated for each row or column of an original image store region or a rotation image store region. The operation of the rotation process for each method for specifying an address will be described below.

At first, the operation when both the read address and the write address are held in the thread is described with reference to FIG. 7A. In this case, four threads are generated such as a thread 1 for a Y4 row processing in the original image store region, a thread 2 for a Y3 row processing, a thread 3 for a Y2 row processing and a thread 4 for a Y1 row processing.

The read address held in the thread 1 is the address of the coordinates (X1,Y4) of the original image store region, and the write address is the address of the coordinates (X4,Y4) of the rotation image store region. Similarly, the read address held in the thread 2 is the address of the coordinates (X1,Y3) of the original image store region, and the write address is the address of the coordinates (X3,Y4) of the rotation image store region. The read address and the write address which are held in the threads 3 and 4 are also determined in accordance with a rule similar to the above-mentioned rule.

The OS assigns the threads 1 to 4 generated as mentioned above to any of the first CPU 10, the second CPU 11, the third CPU 12 and the fourth CPU 13. That is, the OS transfers the threads to the memories of the CPUs being at an empty state. Accordingly, the rotation processes are simultaneously started in the four CPUs. Hereafter, let us suppose that the threads 1, 2, 3 and 4 are assigned to the first CPU 10, the second CPU 11, the third CPU 12 and the fourth CPU 13, respectively.

The first CPU 10 receiving the thread 1 executes the process in accordance with the procedure described in the thread 1. That is, image data B1 is read from a position specified by a read address of a original image store region of the memory 14, namely, the coordinates (X1,Y4), and it is written to a position specified by a write address of a rotation image store region, namely, the coordinates (X4, Y4). After that, sequentially, image data B2 read from the coordinates (X2,Y4) of the original image store region is written to the coordinates (X4,Y3) of the rotation image store region, image data B3 read from the coordinates (X3,Y4) of the original image store region is written to the coordinates (X4,Y2) of the rotation image store region, and image data B4 read from the coordinates (X4,Y4) of the original image store region is written to the coordinates (X4,Y1) of the rotation image store region.

Also, the second CPU 11 receiving the thread 2 executes the process in accordance with the procedure described in the thread 2. That is, image data is read from a position specified by a read address of the original image store region of the memory 14, namely, the coordinates (X1,Y3), and it is written to a position specified by a write address of the rotation image store region, namely, the coordinates (X3, Y4). After that, sequentially, image data read from the coordinates (X2,Y3) of the original image store region is written to the coordinates (X3,Y3) of the rotation image store region, image data read from the coordinates (X3,Y3) of the original image store region is written to the coordinates (X3,Y2) of the rotation image store region, and image data read from the coordinates (X4,Y3) of the original image store region is written to the coordinates (X3,Y1) of the rotation image store region. The operations of the third CPU 12 receiving the thread 3 and the fourth CPU 13 receiving the thread 4 are similar to those of above-mentioned cases.

Next, the operation when only the read address is held in the thread is described with reference to FIG. 7B. In this case, the four threads are generated such as the thread 1 for the Y4 row processing in the original image store region, the thread 2 for the Y3 row processing, the thread 3 for the Y2 row processing and the thread 4 for the Y1 row processing.

The read address held in the thread 1 is the address of the coordinates (X1,Y4) of the original image store region, the read address held in the thread 2 is the address of the coordinates (X1,Y3) of the original image store region, the read address held in the thread 3 is the address of the coordinates (X1,Y2) of the original image store region, and the read address held in the thread 4 is the address of the coordinates (X1,Y1) of the original image store region.

Here, let us suppose that the OS assigns the threads 1 to 4 generated as mentioned above to any of the first CPU 10, the second CPU 11, the third CPU 12 and the fourth CPU 13, similarly to the above-mentioned case.

The first CPU 10 receiving the thread 1 executes the process in accordance with the procedure described in the thread 1. Here, the write address is firstly calculated. That is, a fact that the coordinate when the coordinates (X1,Y4) of the original image store region of the memory 14 is rotated by 90 degrees in the right direction is the coordinates (X4,Y4) is calculated. The address of the coordinates (X4, Y4) of the rotation image store region is determined as a write address. Then, image data B1 is read from a position specified by a read address of the original image store region of the memory 14, namely, the coordinates (X1,Y4), and it is written to a position specified by the write address of a rotation image store region, namely, the coordinates (X4, Y4). After that, similarly, image data B2 read from the coordinates (X2,Y4) of the original image store region is written to the coordinates (X4,Y3) of the rotation image store region, image data B3 read from the coordinates (X3,Y4) of the original image store region is written to the coordinates (X4,Y2) of the rotation image store region, and image data B4 read from the coordinates (X4,Y4) of the original image store region is written to the coordinates (X4,Y1) of the rotation image store region, sequentially.

Also, the second CPU 11 receiving the thread 2 executes the process in accordance with the procedure described in the thread 2. Here, the write address is firstly calculated.

That is, a fact that the coordinate when the coordinates (X1,Y3) of the original image store region of the memory 14 is rotated by 90 degrees in the right direction is the coordinates (X3,Y4) is calculated. The address of the coordinates (X3,Y4) of the rotation image store region is determined as a write address. Then, image data is read from a position specified by a read address of the original image store region of the memory 14, namely, the coordinates (X1,Y3), and it is written to a position specified by the write address of the rotation image store region, namely, the coordinates (X3, Y4). After that, similarly, image data read from the coordinates (X2,Y3) of the original image store region is written to the coordinates (X3,Y3) of the rotation image store region, image data read from the coordinates (X3,Y3) of the original image store region is written to the coordinates (X3,Y2) of the rotation image store region, and image data read from the coordinates (X4,Y3) of the original image store region is written to the coordinates (X3,Y1) of the rotation image store region, similarly. The operations of the third CPU 12 receiving the thread 3 and the fourth CPU 13 receiving the thread 4 are similar to those of above-mentioned cases.

Next, the operation when only the write address is held in the thread is described with reference to FIG. 7C. In this case, four threads are generated such as a thread 1 for a Y4 row processing in the rotation image store region, a thread 2 for a Y4 row processing, a thread 3 for a Y2 row processing and a thread 4 for a Y1 row processing.

The write address held in the thread 1 is the address of the coordinates (X1,Y4) of the rotation image store region, the write address held in the thread 2 is the address of the coordinates (X1,Y3) of the rotation image store region, the write address held in the thread 3 is the address of the coordinates (X1,Y2) of the rotation image store region, and the write address held in the thread 4 is the address of the coordinates (X1,Y1) of the rotation image store region.

Here, let us suppose that the OS assigns the threads 1 to 4 generated as mentioned above to any of the first CPU 10, the second CPU 11, the third CPU 12 and the fourth CPU 13, similarly to the above-mentioned case.

The first CPU 10 receiving the thread 1 executes the process in accordance with the procedure described in the thread 1. Here, the read address is firstly calculated. That is, a fact that the coordinate when the coordinates (X1,Y4) of the rotation image store region of the memory 14 is rotated by 90 degrees in the left direction is the coordinates (X1,Y1) is calculated. The address of the coordinates (X1,Y1) of the original image store region is determined as a read address. Then, image data B1 is read from a position specified by the calculated read address of the original image store region of the memory 14, namely, the coordinates (X1,Y1), and it is written to a position specified by the write address of the rotation image store region, namely, the coordinates (X1, Y4). After that, similarly, image data B2 read from the coordinates (X1,Y2) of the original image store region is written to the coordinates (X2,Y4) of the rotation image store region, image data B3 read from the coordinates (X1,Y3) of the original image store region is written to the coordinates (X3,Y4) of the rotation image store region, and image data B4 read from the coordinates (X1,Y4) of the original image store region is written to the coordinates (X4,Y4) of the rotation image store region, sequentially.

Also, the second CPU 11 receiving the thread 2 executes the process in accordance with the procedure described in the thread 2. Here, the read address is firstly calculated. That is, a fact that the coordinate when the coordinates (X1,Y3) of the rotation image store region of the memory 14 is rotated by 90 degrees in the left direction is the coordinates (X2,Y1) is calculated. The address of the coordinates (X2,Y1) of the original image store region is determined as a read address. Then, image data is read from a position specified by the determined read address of the original image store region of the memory 14, namely, the coordinates (X2,Y1), and it is written to a position specified by a write address of the rotation image store region, namely, the coordinates (X1,Y3). After that, similarly, image data read from the coordinates (X2,Y2) of the original image store region is written to the coordinates (X2,Y3) of the rotation image store region, image data read from the coordinates (X2,Y3) of the original image store region is written to the coordinates (X3,Y3) of the rotation image store region, and image data read from the coordinates (X2,Y4) of the original image store region is written to the coordinates (X4,Y3) of the rotation image store region, sequentially. The operations of the third CPU 12 receiving the thread 3 and the fourth CPU 13 receiving the thread 4 are similar to those of above-mentioned cases.

As mentioned above, according to this fourth embodiment, even in a case of a process requiring the reference to the entire image data, the process can be performed in parallel in the plurality of CPUs (threads). Thus, it is possible to attain the high-speed processing. Moreover, it is not necessary to separately mount the integral-processing portion for the process for referring to the entire image, such as the case of the third prior art. Hence, the appearance inspection apparatus can be constructed simply and cheaply.

Figure 8:
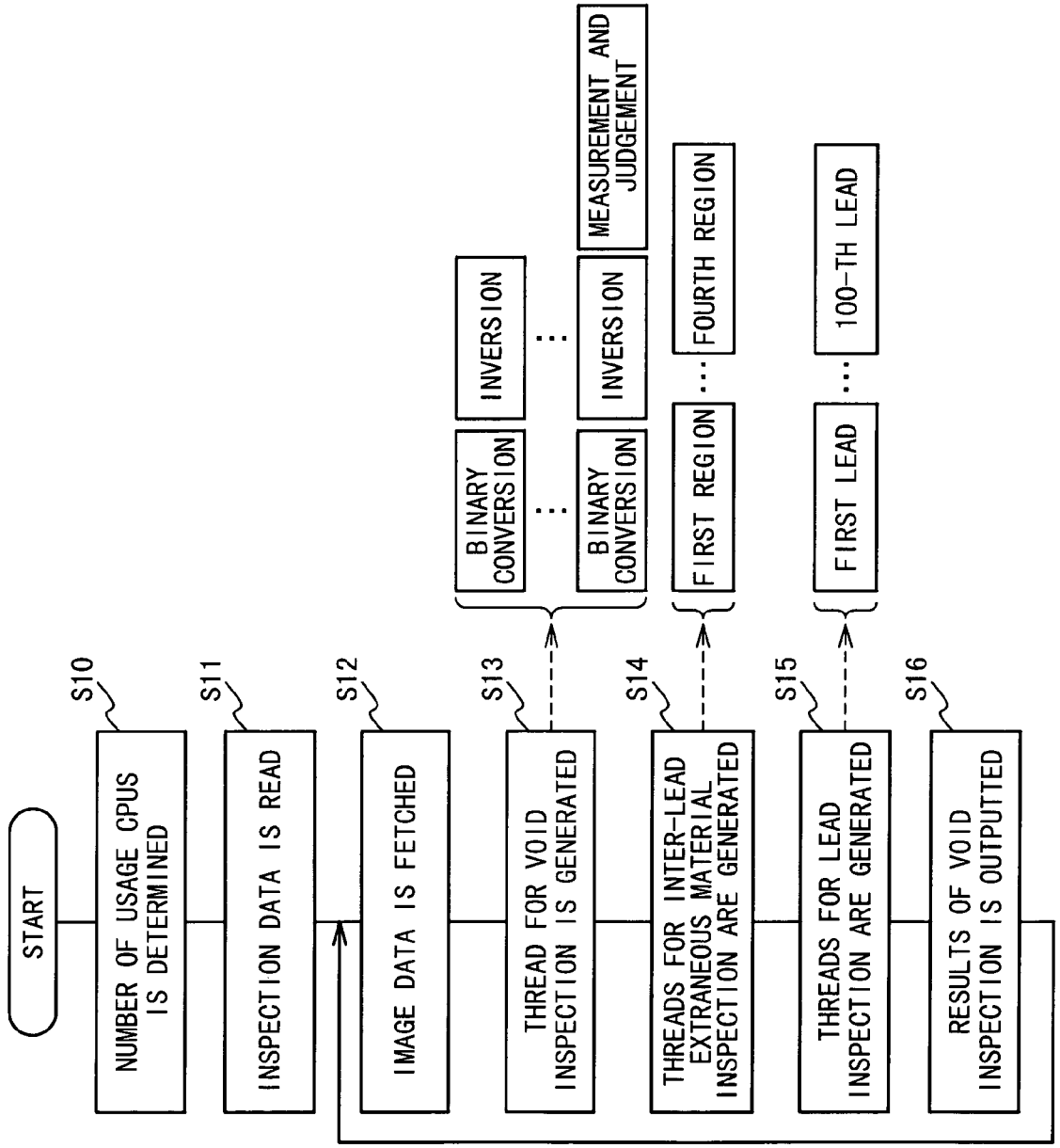
FIG. 8 is a flowchart showing a flow of an entire process in the appearance inspection apparatus according to the first to third embodiments of the present invention.

The appearance inspection apparatus according to the present invention continuously executes the processes in the first to third embodiments. FIG. 8 shows the flow of the entire process in this appearance inspection apparatus.

In the appearance inspection, the number of CPUs to be used is firstly determined (Step S10). It may be designed such that a predetermined fixed value is used as this number of CPUs, or it may be designed such that a user enters arbitrary values as the number of CPUs. Or, it may be designed such that the number of CPUs installed in the appearance inspection apparatus is automatically obtained by using a program.

Next, inspection data is read from the hard disc drive 15 (Step S11). Then, an image data is fetched from the camera 19 (Step S12). Then, threads for a void inspection are generated on the basis of the inspection data and the image data (Step S13). That is, the 13 threads to execute the void inspection are generated as described in the first and second embodiments. The thus-generated threads are sent to the first CPU 10, the second CPU 11, the third CPU 12 and the fourth CPU 13, under the control of the OS. So, the void inspection is executed.

Next, threads for an inter-lead extraneous material inspection are generated in accordance with the inspection data and the image data (Step S14). That is, the four threads to execute the inter-lead extraneous material inspection are generated as described in the third embodiment. The thus-generated threads are sent to the first CPU 10, the second CPU 11, the third CPU 12 and the fourth CPU 13, under the control of the OS. So, the inter-lead extraneous material inspection is executed.

Next, threads for a lead inspection are generated in accordance with the inspection data and the image data (Step S15). That is, the 400 threads to execute the lead inspection are generated as described in the third embodiment. The thus-generated threads are sent to the first CPU 10, the second CPU 11, the third CPU 12 and the fourth CPU 13, under the control of the OS. So, the lead inspection is executed. The thread generator of the present invention is composed of the processing of above-mentioned steps S13, S14 and S15.

After the completion of the above-mentioned processes, the respective results of the void inspection, the inter-lead extraneous material inspection and the lead inspection are outputted (Step S16). After that, the sequence returns back to the step S12. Then, the appearance inspection is performed on a next IC.

As mentioned above, the appearance inspection apparatuses according to the first to fourth embodiments are designed such that each of them has only one memory 14 for storing the image data, and all the CPUs access to this memory 14. This configuration does not require that the image data is divided and stored in a plurality of memories that are mounted correspondingly to respective CPUs, such as the conventional technique. As a result, this configuration does not require the process for dividing the image data. Thus, it is possible to improve the processing speed. Moreover, it is not necessary to equip a plurality of memories. Hence, the appearance inspection apparatus can be configured simply and cheaply.

Also, in this appearance inspection apparatus, the entire process is completed by that the threads assigned for CPUs by the OS are processed, respectively. Thus, this does not require the members so as to manage the entire system, such as the process distribution portion, the master CPU and the integral-processing portion, as described in the conventional techniques. As a result, this does not require even the time necessary for the operations of the members. Thus, it is possible to attain the high-speed processing in the appearance inspection apparatus and also possible to configure the appearance inspection apparatus simply and cheaply.

As detailed above, the present invention can provide the appearance inspection apparatus and the appearance inspection method that can execute an appearance inspection at a high speed, irrespectively of a simple configuration.

What is claimed is:

1. An appearance inspection apparatus comprising:
    a memory that stores image data of an appearance of an inspection target;
    a thread generator that generates k sets of n (k is a positive integer and n is an integer equal to or greater than 2) threads in each of which procedures are described for respectively processing the image data in n sub-regions obtained by dividing one inspection region on the image data stored in said memory and storing a processing result into said memory; and
    a plurality of CPUs which executes said k sets of said n threads generated by said thread generator in parallel, respectively,
    wherein said thread generator further generates m (m is a positive integer) threads in each of which a procedure is described for collectively processing the image data in said n sub-regions, and one of said plurality of CPUs singly executes said m threads generated by said thread generator.

2. The appearance inspection apparatus according to claim 1, wherein said n and m are determined based on a kind of image processing to be executed or a size of said inspection region.

3. The appearance inspection apparatus according to claim 1, wherein said n and m are determined based on a result of an actual measurement of processing times of said plurality of CPUs under an arbitrary combination of n and m.

4. The appearance inspection apparatus according to claim 1, wherein in each of said n threads, the procedure is described for executing a predetermined kind of image processing and another kind of image processing in succession.

5. An appearance inspection method comprising the steps of:
    storing image data of an appearance of an inspection target in a memory;
    generating k sets of n (k is a positive integer and n is an integer equal to or greater than 2) threads in which procedures are described for respectively processing the image data in n sub-regions obtained by dividing one inspection region on the image data stored in said memory and storing a processing result into the memory;
    executing the generated k sets of said n threads in parallel;
    generating m (m is a positive integer) threads in each of which a procedure is described for collectively processing the image data in said n sub-regions; and
    executing said generated m threads in serial.

6. The appearance inspection method according to claim 5, wherein said n and m are determined based on a kind of image processing to be executed or a size of said inspection region.

7. The appearance inspection method according to claim 5, wherein said n and m are determined based on a result of an actual measurement of processing times executed under an arbitrary combination of n and m.

8. The appearance inspection method according to claim 5, wherein in each of said n threads, the procedure is described for executing a predetermined kind of image processing and another kind of image processing in succession.

* * * * *